(12) United States Patent
Zhong et al.

(10) Patent No.: US 11,456,231 B2
(45) Date of Patent: Sep. 27, 2022

(54) HEATSINK ARRANGEMENT FOR INTEGRATED CIRCUIT ASSEMBLY AND METHOD FOR ASSEMBLING THEREOF

(71) Applicant: Fortinet, Inc., Sunnyvale, CA (US)

(72) Inventors: Shen Sunny Zhong, Burnaby (CA); Qian Yu, Burnaby (CA); Han Hsu, Burnaby (CA)

(73) Assignee: Fortinet, Inc., Sunnyvale, CA (US)

( * ) Notice: Subject to any disclaimer, the term of this patent is extended or adjusted under 35 U.S.C. 154(b) by 74 days.

(21) Appl. No.: 17/151,570

(22) Filed: Jan. 18, 2021

(65) Prior Publication Data

US 2022/0230936 A1  Jul. 21, 2022

(51) Int. Cl.
| | |
|---|---|
| *H01L 25/00* | (2006.01) |
| *H01L 23/40* | (2006.01) |
| *H01L 25/065* | (2006.01) |
| *H01L 23/467* | (2006.01) |
| *H01L 23/473* | (2006.01) |

(52) U.S. Cl.
CPC ...... *H01L 23/4006* (2013.01); *H01L 25/0652* (2013.01); *H01L 25/0657* (2013.01); *H01L 25/50* (2013.01); *H01L 23/467* (2013.01); *H01L 23/473* (2013.01); *H01L 2023/4087* (2013.01); *H01L 2225/06589* (2013.01)

(58) Field of Classification Search
CPC ............ H01L 23/4006; H01L 25/0652; H01L 25/0657
See application file for complete search history.

(56) References Cited

U.S. PATENT DOCUMENTS

| | | | |
|---|---|---|---|
| 2013/0256865 A1* | 10/2013 | Umeki ................ | H01L 23/3135 257/690 |
| 2018/0235070 A1* | 8/2018 | Brocklesby ........... | H01L 23/427 |
| 2019/0045663 A1* | 2/2019 | Shia ..................... | H01L 23/427 |
| 2020/0149830 A1* | 5/2020 | Lin ......................... | F28F 13/12 |
| 2020/0258805 A1* | 8/2020 | Yokochi ............. | H01L 23/5385 |
| 2021/0249324 A1* | 8/2021 | Wan .................... | H01L 23/5386 |
| 2022/0087056 A1* | 3/2022 | El-Batal ............... | H05K 7/2039 |
| 2022/0095487 A1* | 3/2022 | El-Batal ............. | H05K 7/20727 |

* cited by examiner

*Primary Examiner* — Thao P Le
(74) *Attorney, Agent, or Firm* — HDC Intellectual Property Law, LLP

(57) ABSTRACT

Various heatsink arrangements, and methods for implementing and using such are discussed.

20 Claims, 10 Drawing Sheets

HEATSINK ARRANGEMENT FOR INTEGRATED CIRCUIT ASSEMBLY AND METHOD FOR ASSEMBLING THEREOF

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever. Copyright © 2020, Fortinet, Inc.

BACKGROUND

Field

Embodiments of the subject matter described herein generally relate to an integrated circuit assembly with at least two chipsets stacked vertically with respect to each other. In particular, embodiments relate to a heatsink arrangement for such an integrated circuit assembly that helps to reduce an overall height and/or footprint of the stacked integrated circuit assembly while achieving higher thermal performance.

Description of the Related Art

Due of increased computing demands, modern computing devices may require multiple chipsets, including some specialized chipsets, to achieve required performance. When there is no strict dimensional constraint in width and depth of an enclosure, chipsets are generally laid flat on a motherboard. When there is a dimensional constraint in width or depth, however, manufacturers tend to vertically stack the chipsets, in a top and bottom layout, by creating a mezzanine hoard and placing some chipsets onto the mezzanine board. Further, in any high-performance electronic system, heatsinks may be an essential component to support the proper functionality of chipsets. Oftentimes, heatsinks are also one of the components that take up a high percentage of the footprint/space within an electronic enclosure. This becomes an issue when a vertically stacked integrated circuit system needs to be designed to fit into a confined enclosure. Although the above-described double layer layout configuration reduces the footprint required in width or depth, it almost doubles the height of the enclosure needed to fit in a mezzanine board, chipsets, and heatsinks. Thus, neither of the two conventional configurations effectively utilized the space and can thus pose a challenge for many manufacturers to design a higher-density integrated circuit system within a confined space.

SUMMARY

Embodiments of the subject matter described herein generally relate to an integrated circuit assembly with at least two chipsets stacked vertically with respect to each other. In particular, embodiments relate to a heatsink arrangement for such an integrated circuit assembly that helps to reduce art overall height and/or footprint of the stacked integrated circuit assembly while achieving higher thermal performance.

This summary provides only a general outline of some embodiments. Many other objects, features, advantages and other embodiments will become more fully apparent from the following detailed description, the appended claims and the accompanying drawings and figures.

BRIEF DESCRIPTION OF THE DRAWINGS

In the Figures, similar components and/or features may have the same reference label. Further, various components of the same type may be distinguished by following the reference label with a second label that distinguishes among the similar components. If only the first reference label is used in the specification, the description is applicable to any one of the similar components having the same first reference label irrespective of the second reference label.

DETAILED DESCRIPTION

Figure 1:
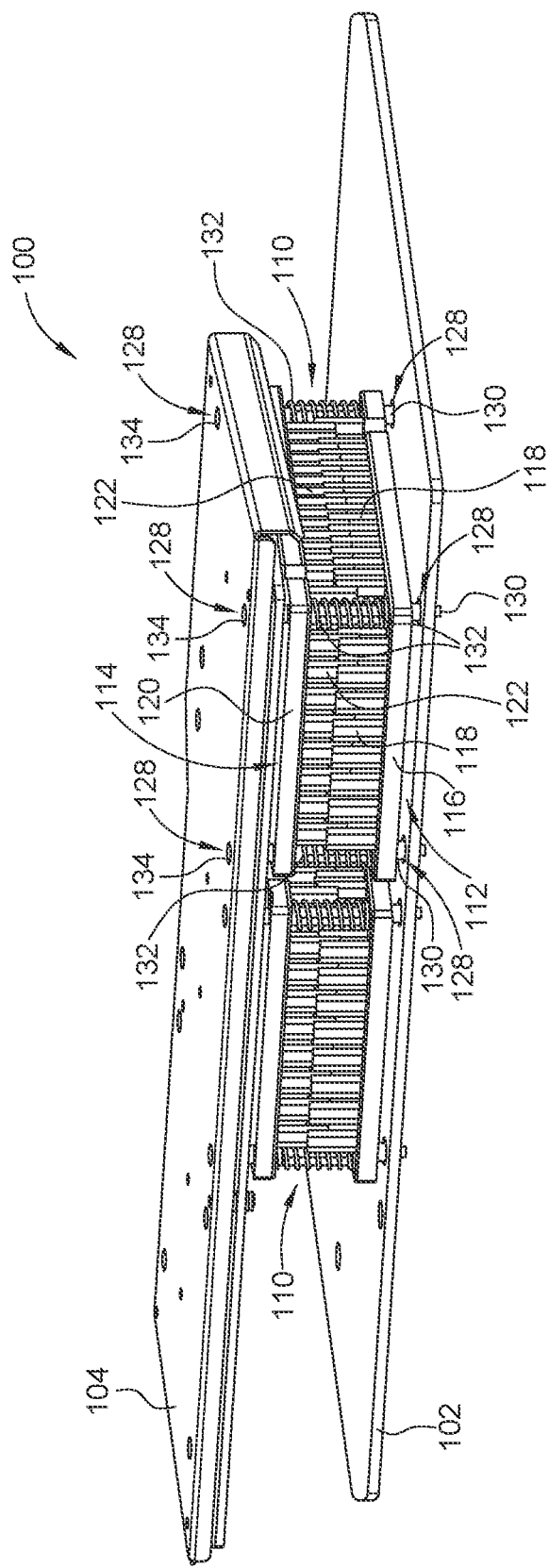
FIG. 1 illustrates an isometric view of an integrated circuit assembly in accordance with an embodiment of the present disclosure.

A heatsink arrangement for an integrated circuit assembly and a method of assembling thereof is described. Various embodiments described herein provide a compact heatsink arrangement for the integrated circuit assembly where a mezzanine board is used. The design provides additional fin height thus more fin area, and therefore, may achieve higher thermal performance.

In the following description, numerous specific details are set forth to provide a thorough understanding of embodiments of the present disclosure. It will be apparent to one skilled in the art that embodiments of the present disclosure may be practiced without some of these specific details.

Terminology

Brief definitions of terms used throughout this application are given below.

The terms "connected" or "coupled" and related terms are used in an operational sense and are not necessarily limited to a direct connection or coupling. Thus, for example, two devices may be coupled directly, or via one or more intermediary media or devices. As another example, devices may be coupled in such a way that information can be passed there between, while not sharing any physical connection with one another. Based on the disclosure provided herein, one of ordinary skill in the art will appreciate a variety of ways in which connection or coupling exists in accordance with the aforementioned definition.

If the specification states a component or feature "may", "can", "could", or "might" be included or have a characteristic, that particular component or feature is not required to be included or have the characteristic.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The phrases "in an embodiment," "according to one embodiment," and the like generally mean the particular feature, structure, or characteristic following the phrase is included in at least one embodiment of the present disclosure and may be included in more than one embodiment of the present disclosure. Importantly, such phrases do not necessarily refer to the same embodiment.

Exemplary embodiments will now be described more fully hereinafter with reference to the accompanying drawings, in which exemplary embodiments are shown. This disclosure may, however, be embodied in many different forms and should not be construed as limited to the embodiments set forth herein. These embodiments are provided so that this disclosure will be thorough and complete and will fully convey the scope of the disclosure to those of ordinary skill in the art. Moreover, all statements herein reciting embodiments of the disclosure, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure).

Thus, for example, it will be appreciated by those of ordinary skill in the art that the diagrams, schematics, illustrations, and the like represent conceptual views or processes illustrating systems and methods embodying the subject matters of this disclosure. Those of ordinary skill in the art further understand that the exemplary hardware, processes, and/or methods described herein are for illustrative purposes and, thus, are not intended to be limited to any particular named.

Various embodiments provide a heatsink arrangements for an integrated circuit assembly having a first board with a first chipset mounted thereon and a second board with a second chipset mounted thereon. The heatsink arrangements include a first heatsink comprising a base, having a first side and a second side, and a set of fins extending outwardly from the first side of the base of the first heatsink, with the second side of the base of the first heatsink configured to be disposed in contact with the first chipset. The heatsink arrangement further comprises a second heatsink comprising a base, having a first side and a second side, and a set of fins extending outwardly from the first side of the base of the second heatsink, with the second side of the base of the second heatsink configured to be disposed in contact with the second chipset. In the heatsink arrangement, the first board and the second board are arranged with respect to each other such that the first side of the base of the second heatsink is disposed facing the first side of the base of the first heatsink, with the set of fins of the second heatsink interposed with the set of fins of the first heatsink.

Other embodiments provide methods for assembling an integrated circuit assembly from a first board with a first chipset mounted thereon and a second hoard with a second chipset mounted thereon. The methods include disposing a first heatsink comprising a base, having a first side and a second side, and a set of fins extending outwardly from the first side of the base of the first heatsink, over the first chipset, with the second side of the base of the first heatsink disposed in contact with the first chipset. The method further comprises disposing a second heatsink comprising a base, having a first side and a second side, and a set of fins extending outwardly from the first side of the base of the second heatsink, over the first heatsink such that the first side of the base of the second heatsink is disposed facing the first side of the base of the first heatsink, with the set of fins of the second heatsink interposed with the set of fins of the first heatsink. The method further comprises arranging the first board and the second board with respect to each other such that the second side of the base of the second heatsink is disposed in contact with the second chipset.

Yet other embodiments provide integrated circuit assemblies including a first board with a first chipset mounted thereon and a second board with a second chipset mounted thereon. The integrated circuit assembly further comprises a heatsink arrangement. The heatsink arrangement comprises a first heatsink comprising a base, having a first side and a second side, and a set of fins extending outwardly from the first side of the base of the first heatsink, with the second side of the base of the first heatsink configured to be disposed in contact with the first chipset. The heatsink arrangement further comprises a second heatsink comprising a base, having a first side, and a second side, and a set of fins extending outwardly from the first side of the base of the second heatsink, with the second side of the base of the second heatsink configured to be disposed in contact with the second chipset. In the heatsink arrangement, the first board and the second board are arranged with respect to each other such that the first side of the base of the second heatsink is disposed facing the first side of the base of the first heatsink, with the set of fins of the second heatsink interposed with the set of fins of the first heatsink.

A heatsink arrangement is described for an integrated circuit assembly having a first board with a first chipset mounted thereon and a second board with a second chipset mounted thereon is described. The heatsink arrangement may include a first heatsink with a base, having a first side and a second side, and a set of fins extending outwardly from the first side of the base of the first heatsink, with the second side of the base of the first heatsink configured to be disposed in contact with the first chipset. The heatsink arrangement may further include a second heatsink with a base, having a first side and a second side, and a set of fins extending outwardly from the first side of the base of the second heatsink, with the second side of the base of the second heatsink configured to be disposed in contact with the second chipset. In the heatsink arrangement of the present disclosure, the first board and the second board are arranged with respect to each other such that the first side of the base of the second heatsink is disposed facing the first side of the base of the first heatsink, with the set of tins of the second heatsink interposed with the set of fins of the first heatsink.

Figure 2:
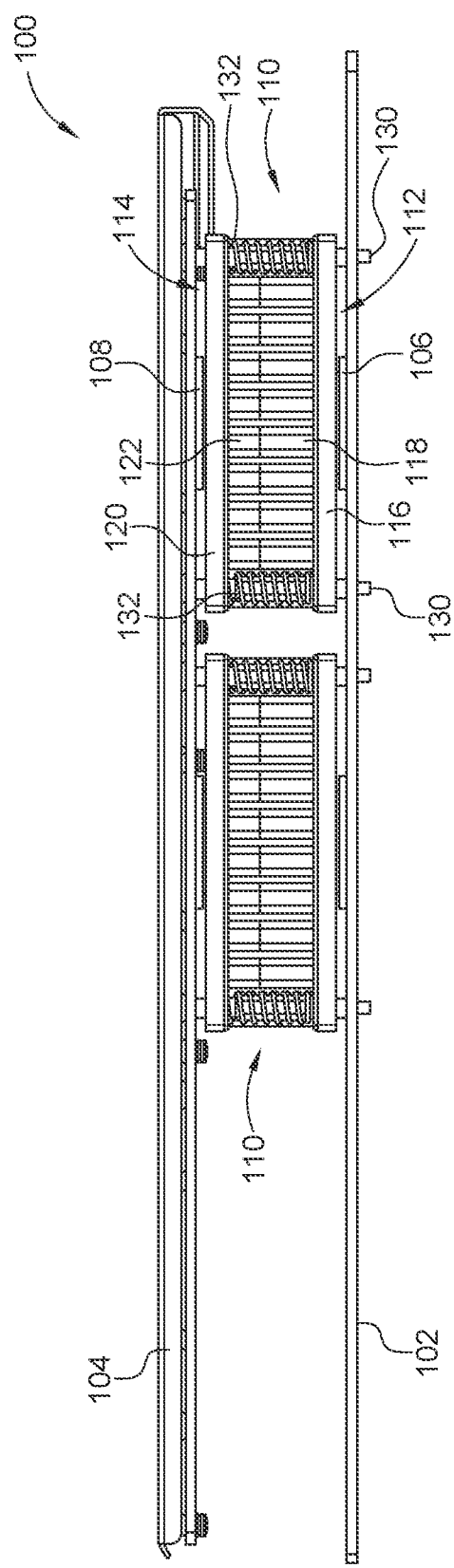
FIG. 2 illustrates a side view of the integrated circuit assembly of FIG. 1.
Figure 3:
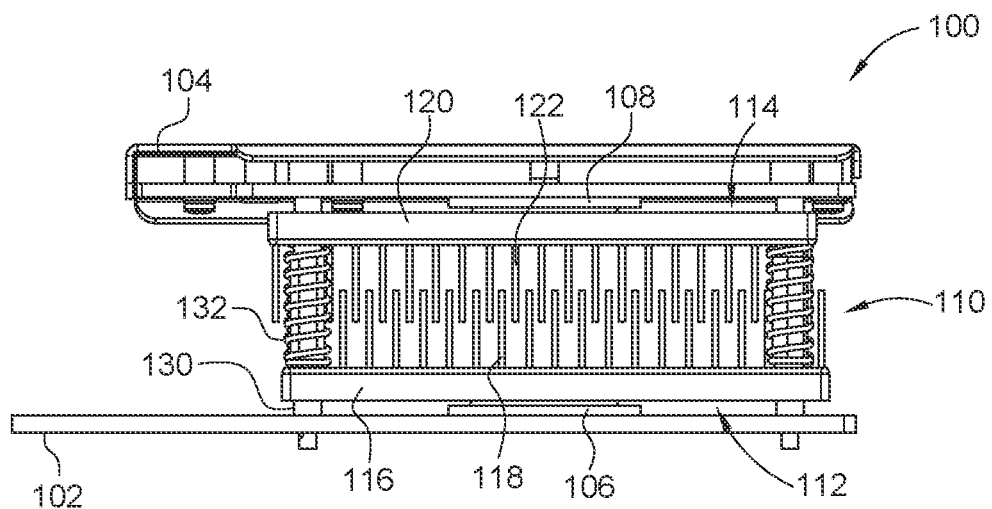
FIG. 3 illustrates a front view of the integrated circuit assembly of FIG. 1.

FIGS. 1-3 illustrate different views of an integrated circuit assembly 100 in accordance with an embodiment of the present disclosure. According to an embodiment, the integrated circuit assembly 100 may include a first board 102 and a second board 104. Herein, the first board 102 may be a main circuit board, a motherboard, or a parent board, and the second board 104 may be a mezzanine or a child board which is mechanically and electrically connected to the first board 102. It may be appreciated that in other examples, the integrated circuit assembly 100 may include more than two boards, for instance a third board (not shown), in addition to the first board 102 and the second board 104, which may also be a mezzanine or a child board and is mechanically and electrically connected to the first board 102 as well as the second board 104, without departing from the spirit and the scope of the present disclosure. Such a third board may be positioned parallel to one or both of the first board 102 and the second board 104, including, but not limited to, in the same plane as one of the boards. Each board 102, 104 has respective circuit components mounted thereon. Specifically, the first board 102 may include a first chipset 106 mounted thereon and the second board 104 may include a second chipset 108 mounted thereon. Chipsets 106, 108 generate heat when in use, the transfer of which away from each chipset may be important their continued functioning. In the illustrated embodiments of FIGS. 1-3, each of the first board 102 and the second board 104 is shown to include multiple chipsets, specifically two chipsets each, and thus the integrated circuit assembly 100 includes two pairs of chipsets. It may be contemplated that details as described herein for one of the pair of chipsets with respect to the corresponding boards may also be applied to other pair(s) of chipsets in the present integrated circuit assembly 100 without any limitations. In general terms, each board may have one or a plurality of chipsets thereon, and each chipset may be the same or different from the other chipsets in physical dimension(s), heat production, or both.

In the present embodiments, as illustrated, the first board 102 and the second board 104 may be arranged in a stacked configuration. In particular, the first board 102 and the second board 104 may be arranged such that the first chipset 106 in the first board 102 and the second chipset 108 in the second board 104 are vertically aligned, with the second chipset 108 being placed directly over the first chipset 106. Specifically, in the present embodiments, the first chipset 106 and the second chipset 108 are facing each other in the stacked configuration of the integrated circuit assembly 100. It may be appreciated that such stacked configuration of the integrated circuit assembly 100 helps to reduce the physical dimensions of the integrated circuit assembly 100, i.e., the footprint required in width and/or depth albeit with increased height, as compared to conventional circuit boards in which the components are laid flat. In embodiments, the chipsets themselves may not be vertically aligned, but heatsinks for each chipset, having footprints larger than the associated chipset, may be vertically aligned as described elsewhere herein.

Figure 4:
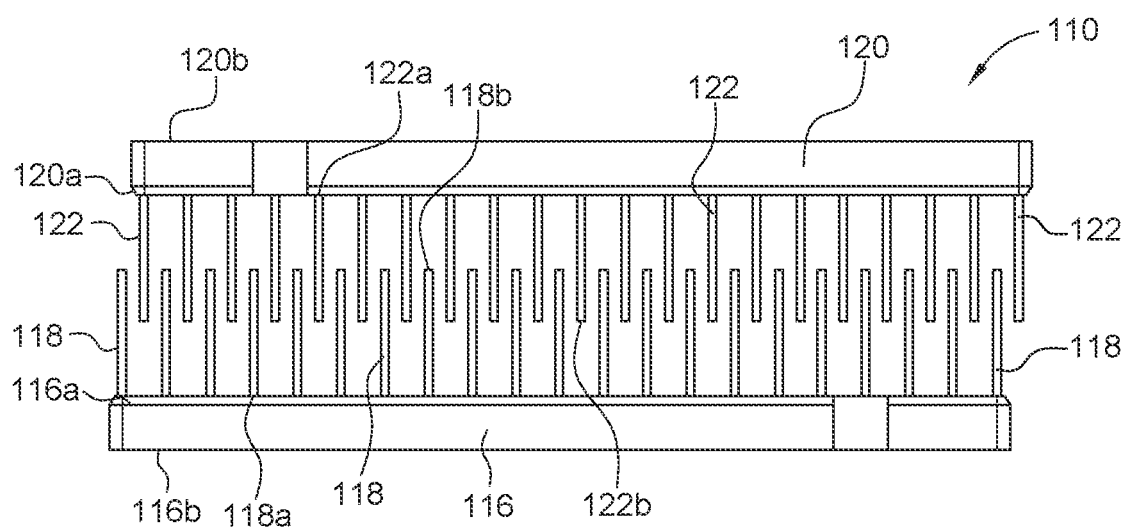
FIG. 4 illustrates a front view of a heatsink arrangement for the integrated circuit assembly of FIG. 1 in accordance with an embodiment of the present disclosure.
Figure 5:
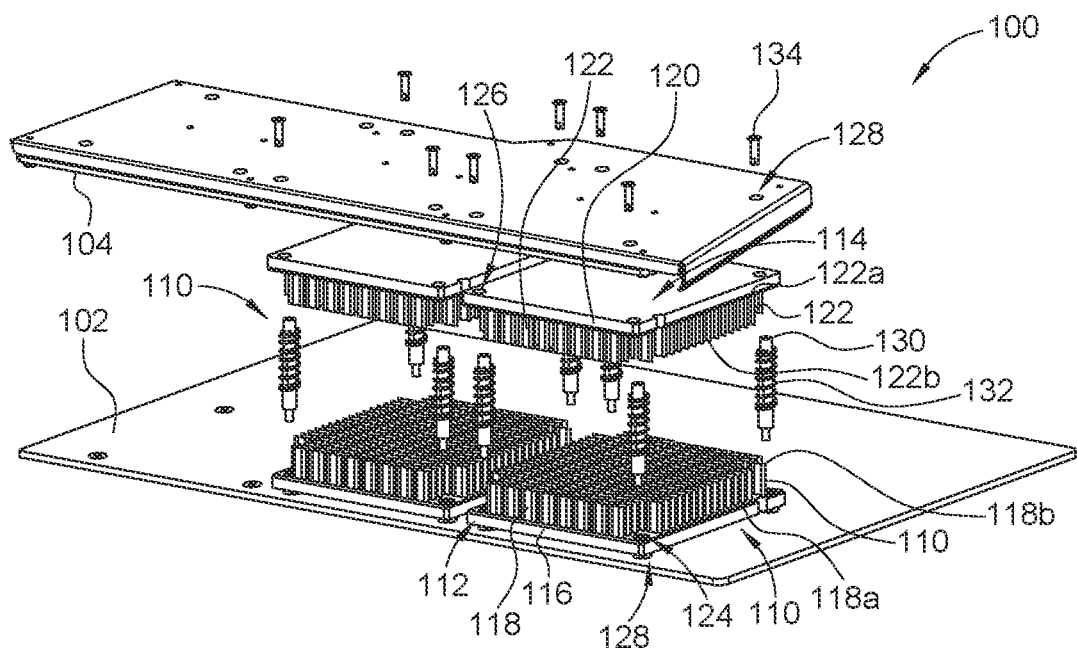
FIG. 5 illustrates an isometric exploded view of the integrated circuit assembly of FIG. 1.
Figure 6:
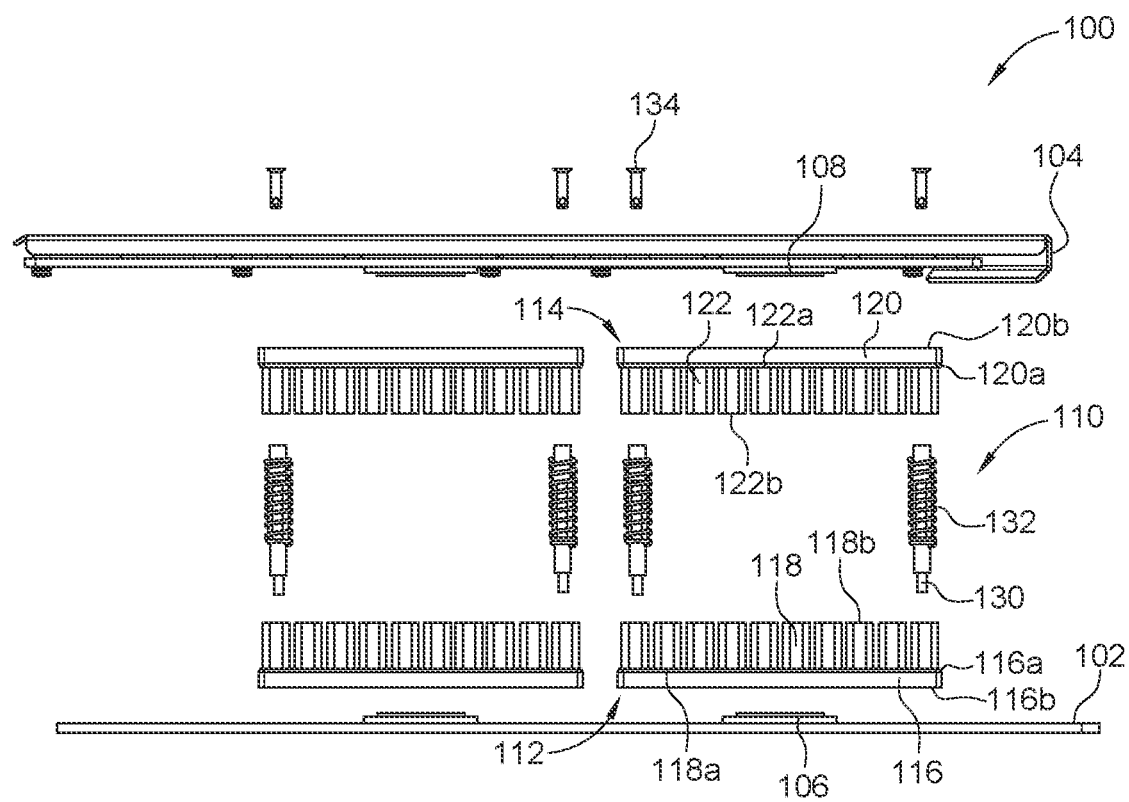
FIG. 6 illustrates a planar exploded view of the integrated circuit assembly of FIG. 1.

As illustrated, the integrated circuit assembly 100 includes a heatsink arrangement 110. FIG. 4 illustrates a front view of the heatsink arrangement 110 for the integrated circuit assembly 100 in accordance with an embodiment of the present disclosure. Further, FIGS. 5-6 illustrate exploded views of the integrated circuit assembly 100 in accordance with an embodiment of the present disclosure. Referring to FIGS. 1-6 in combination, as shown, the heatsink arrangement 110 includes a first heatsink 112 and a second heatsink 114. Herein, the heatsinks 112, 114 are generally unitary structures which are utilized to solve the problems associated with cooling of the chipsets, such as the first chipset 106 and the second chipset 108 in the integrated circuit assembly 100. In one or more examples, the heatsinks 112, 114 are generally made of a thermally conductive material, for example a metal such as aluminum or copper. Aluminum is preferable in those circumstances in which lightweight, less costly, or more easily transportable, assemblies are desired.

Herein, the first heatsink 112 includes a base 116. The base 116 has a first side 116a and a second side 11613. The first heatsink 112 also includes a set of fins 118 extending outwardly from the first side 116a of the base 116 therein. Herein, the set of fins 118 includes a plurality of fins which are generally arranged in the form of an array over the first side 116a of the base 116 of the first heatsink 112, e.g., in rows and columns of fins as describe elsewhere herein. As may be better seen in FIGS. 2-3 and in FIGS. 5-6, the second side 116b of the base 116 of the first heatsink 112 is configured to be disposed in contact with the first chipset 106. In some examples, the second side 116b of the base 116 of the first heatsink 112 may include a recess (not shown) which may accommodate the first chipset 106 therein to dispose the first heatsink 112 in intimate thermal contact with the respective first chipset 106. Further, as shown, each fin 118 includes a first end 118a and a second end 118b, with the fins 118 extending outwardly from the first side 116a of the base 116 from the first ends 118a thereof, and the second ends 118b of the fins 118 being generally free ends in the present heatsink arrangement 110.

Similarly, the second heatsink 114 includes a base 120. The base 120 has a first side 120a and a second side 120b. The second heatsink 114 also includes a set of fins 122 extending outwardly from the first side 120a of the base 120 therein. Herein, the set of fins 122 includes a plurality of fins which are generally arranged in the form of an array over the first side 120a of the base 120 of the second heatsink 114, e.g., in rows and columns of fins as describe elsewhere herein. As may be better seen in FIGS. 2-3 and in FIGS. 5-6, the second side 120b of the base 120 of the second heatsink 114 is configured to be disposed in contact with the second chipset 108. In some examples, the second side 120b of the base 120 of the second heatsink 114 may include a recess (not shown) which may accommodate the second chipset 108 therein in to dispose the second heatsink 114 in intimate thermal contact with the respective second chipset 108. Further, as shown, each fin 122 includes a first end 122a and a second end 122b, with the fins 122 extending outwardly from the first side 120a of the base 120 from the first ends 122a thereof, and the second ends 122b of the fins 122 being generally free ends in the present heatsink arrangement 110. In general terms, any additional chipset may be disposed in intimate contact with a portion of a heatsink as described herein and may have a dedicated heatsink or may share a heatsink with one or more other chipsets.

Again, referring to FIGS. 1-6 in combination, as shown, in the integrated circuit assembly 100 of the present disclosure, the first board 102 and the second board 104 may be arranged with respect to each other such that the first side 120a of the base 120 of the second heatsink 114 is disposed facing, which may be parallel to, the first side 116a of the base 116 of the first heatsink 112. In other words, the second board 104 may be inverted/flipped and placed over the first board 102, in the integrated circuit assembly 100. Further, according to embodiments of the present disclosure, the set of fins 122 of the second heatsink 114 are staggered between, interleaved with, and/or interposed with the set of fins 118 of the first heatsink 112. That is, the fins in the set of fins 122 of the second heatsink 114 are disposed interstitially between the fins in the set of fins 118 of the first heatsink 112. This provides a compact configuration for the heatsink arrangement 110 having at least a paired heatsink design, with the first heatsink 112 sitting on the first board 102 and the second heatsink 114 sitting on the second board 104, strategically placed face-to-face with each other, and with the set of fins 118 from the first heatsink 112 staggered between interleaved with, and/or interposed with the set of fins 122 from the second heatsink 114 with which it is paired. Herein, the heatsink arrangement 110 may be provided with the heatsinks 112, 114 sandwiched between the first board 102 and the second board 104 in the integrated circuit assembly 100. In general terms, the fins of one heatsink may be the same or different from the fins of a facing heatsink, so long as the fin pitch, described elsewhere herein, is the same for both heatsinks.

As better illustrated in FIGS. 5-6, each of the first heatsink 112 and the second heatsink 114 may include a set of mounting holes to facilitate mounting each heatsink to a board. As shown, the first heatsink 112, with a generally square shape, may include four mounting holes 124 formed at each of the four corners thereof. Similarly, the second heatsink 114, with a generally square shape, may include four mounting holes 126 formed at each of the four corners thereof. It may be appreciated the heatsinks 112, 114 may have some other suitable shape including, but not limited to, rectangular, circular or the like, depending on a shape of the chipsets onto and against which the heatsinks are mounted. In some examples, the two heatsinks 112, 114 may have different shapes from each other, for instance the first heatsink 112 having a square shape and the second heatsink 114 having a non-square rectangular shape without any limitations, as long as the corresponding set of fins 118, 122 therein could be arranged interposed with respect to each other. Further, it may be seen that the first board 102 and the second board 104 have mounting holes 128 complementary to the mounting holes 124, 126 in the respective first heatsink 112 and the second heatsink 114 mounted therewith, i.e., when oriented as illustrated in FIG. 6, mounting holes of one heatsink are vertically aligned with mounting holes of the other heatsink.

Further, as illustrated, the heatsink arrangement 110 may include a set of standoff fasteners, complementary to the set of mounting holes. Herein, the heatsink arrangement 110 may include four standoff fasteners 130, one for each hole in the heatsink. Each standoff fastener 130 may be inserted through one of the mounting holes 124 in the first heatsink 112 and a corresponding one of the mounting holes 126 in the second heatsink 114. Specifically, each standoff fastener 130 may first be inserted through mounting hole in one of the boards, say, one of the mounting holes 128 in the second board 104, then through the corresponding mounting hole 126 in the second heatsink 114 and further through the corresponding mounting hole 124 in the first heatsink 112, to sandwich the heatsink arrangement 110 between the boards 102, 104. It may be contemplated that, herein, the corresponding mounting holes may refer to the vertically (axially) aligned mounting holes in the stacked configuration of the integrated circuit assembly 100. In the present embodiments, a height of the standoff fasteners 130 may be based on a desired gap between: the second end 118b of the fins 118 in the set of fins of the first heatsink 112 and the first side 120a of the base 120 of the second heatsink 114; or, the second end 122b of the fins 122 in the set of fins of the second heatsink 114 and the first side 116a of the base 116 of the first heatsink 112; or, both. The gaps thus described are present when the first board 102 and the second board 104 are arranged with respect to each other in the integrated circuit assembly 100, which is generally being dependent on the space constraint and thermal performance.

In one or more embodiments, the heatsink arrangement 110 may also include a set of biasing devices, which may be coil springs, resilient sleeves, wave washers, or the like, including four springs 132, complementary to the set of standoff fasteners, i.e., one biasing device per standoff fastener. Herein, each spring 132 is arranged around or over one of the standoff fasteners 130. A purpose of the springs 132 is to push the heatsinks 112, 114 with sufficient force onto the respective chipsets 106, 108 to maximize heat transfer therebetween, to push the heatsinks apart, and/or both. Further, the springs 132 may be selected based on the exertion force to be applied on the heatsinks 112, 114. Herein, a force exerted by the set of springs 132 is based on the spring constant, the spring preloading, and desired gaps between the second ends 118b, 122b of the fins 118, 122 in the set of fins of the first and second heatsinks 112, 114 and the first sides 120a, 116a of the base 120, 116 of the first and second heatsinks 112,114, the force pushing the first board 102 and the second board 104 away from each other, when the first board 102 and the second board 104 are arranged with respect to each other in the integrated circuit assembly 100.

Further, as illustrated, the heatsink arrangement 110 also may include a set of fasteners, e.g., screws, specifically four screws 134, complementary to the set of standoff fasteners. Once the heatsink arrangement 110 is sandwiched between the boards 102, 1.04, the screws 134 may be coupled and tightened with the standoff fasteners 130 to mount the heatsink arrangement 110 between the boards 102, 104, for assembling the integrated circuit assembly 100 according to embodiments of the present disclosure. When so constructed, one or both heatsinks 112, 114 float on the one or more standoff fasteners 130, with the springs 132 biasing one or both of the heatsinks away from each other and into direct contact with one or more chipsets 106, 108. Such mechanical arrangement using standoff fasteners, springs, and screws for coupling the heatsink arrangement 110 with multiple heatsinks, e.g., the two heatsinks 112, 114 (even with the two heatsinks 112, 114 facing each other) in the integrated circuit assembly 100 with two boards 102, 104 may be contemplated by a person skilled in the art and thus not further explained herein for the brevity of the present disclosure. In embodiments, one or more of each combination of a standoff, spring, and screw fastener may be replaced with another mounting element, e.g., a molly or toggle bolt, adhesive, or the like.

The present disclosure further provides a method for assembling the integrated circuit assembly 100 from the first board 102 with the first chipset 106 mounted thereon and the second board 104 with the second chipset 108 mounted thereon. The various embodiments and variants disclosed above apply mutatis mutandis to the method for assembling the integrated circuit assembly 100.

FIGS. 7A-7E illustrate various stages involved in a method for assembling an integrated circuit assembly in accordance with an embodiment of the present disclosure. The method may include disposing a first heatsink having a base, with a first side and a second side, and a set of fins extending outwardly from the first side of the base of the first heatsink, over the first chipset, with the second side of the base of the first heatsink disposed in contact with the first chipset. The method may further include disposing a second heatsink having a base, with a first side and a second side, and a set of fins extending outwardly from the first side of the base of the second heatsink, over the second chipset, with the second side of the base of the second heatsink disposed in contact with the second chipset. The method may further include arranging the first board and the second board with respect to each other such that the first side of the base of the second heatsink is disposed facing the first side of the base of the first heatsink, with the set of fins of the second heatsink interposed with the set of fins of the first heatsink.

Figure 7A:
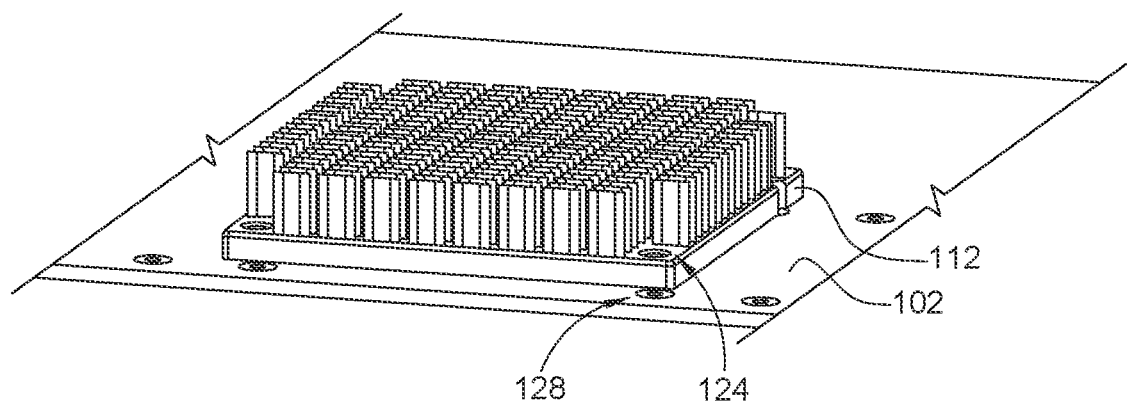
FIGS. 7A-7E illustrate various stages involved in a method for assembling an integrated circuit assembly in accordance with an embodiment of the present disclosure.
Figure 7B:
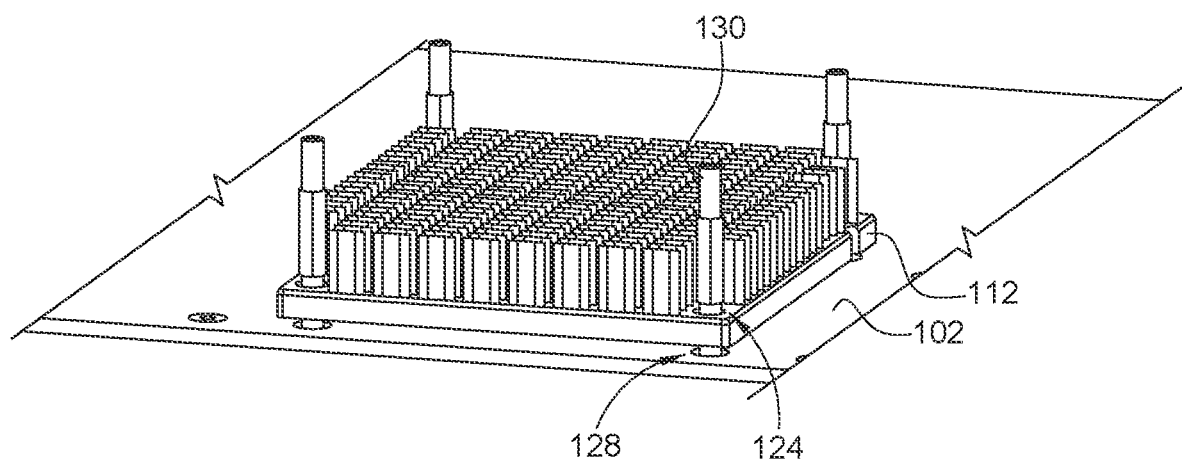
Figure 7C:
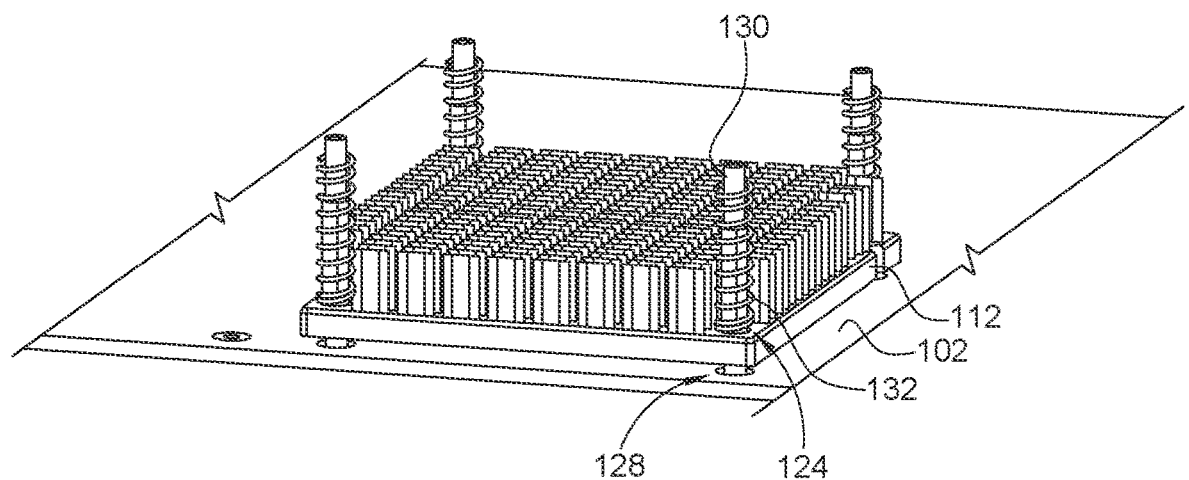
Figure 7D:
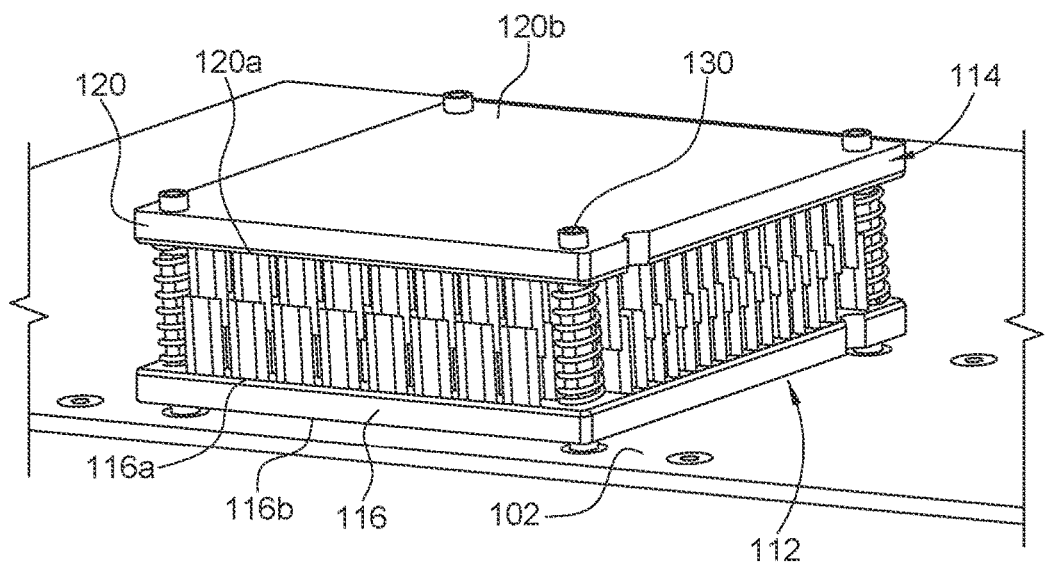
Figure 7E:
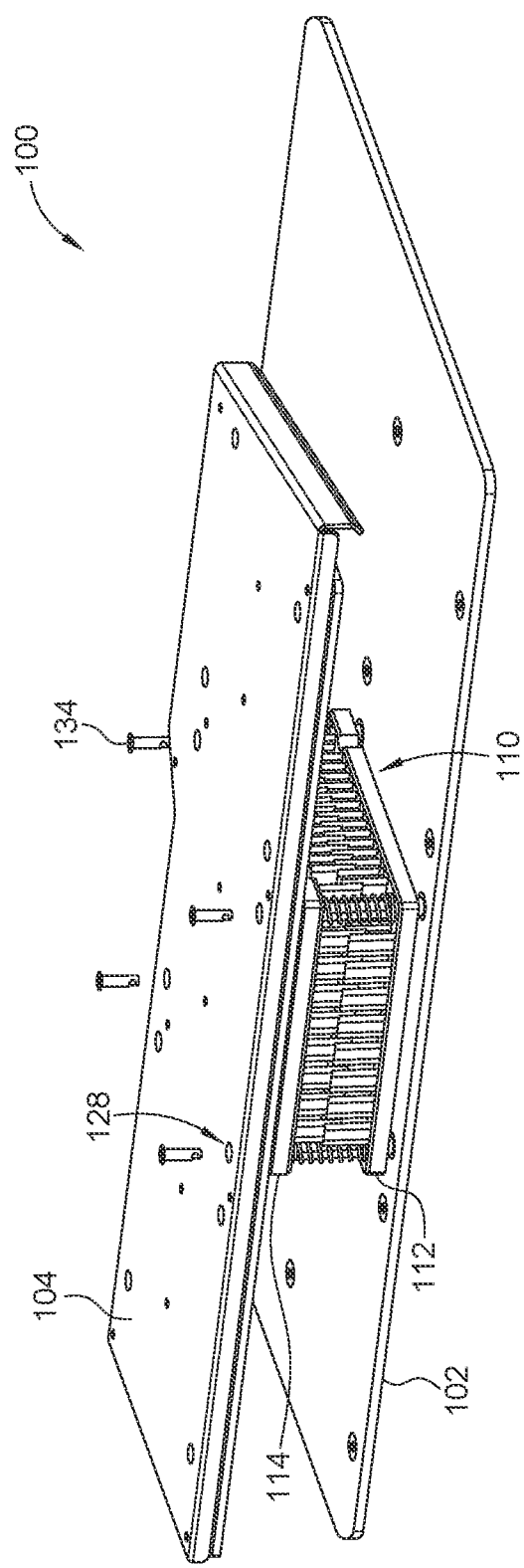

Referring to HO, 7A, as illustrated, to begin with, the first heatsink 112 may be placed over the first board 102 directly over the first chipset 106 (not visible in FIG. 7A) therein. Herein, the first heatsink 112 may be placed over the first board 102 such that the mounting holes 124 in the first heatsink 112 are axially aligned with the mounting holes 128 in the first board 102. Then, as illustrated in FIG. 7B, the standoff fasteners 130 may be passed through the mounting holes 128 in the first board 102 and then through the corresponding mounting holes 124 in the first heatsink 112 to secure the first heatsink 112 with the first board 102. Subsequently, as illustrated in FIG. 7C, a set of biasing devices, e.g., springs, may be provided, with each spring 132 arranged around or over one of the standoff fasteners 130. Thereafter, as illustrated in FIG. 7D, the second heatsink 114 may be placed over the first heatsink 112, with the second heatsink 114 being flipped and rotated with respect to the first heatsink 112, and with the first side 120a of the base 120 of the second heatsink 114 disposed facing the first side 116a of the base 116 of the first heatsink 112, such that the fins 122 of the second heatsink 114 are nested or staggered between, interleaved with, and/or interposed with and within the fins 118 of the first heatsink 112, and vice versa. Herein, the second heatsink 114 may be placed over the first heatsink 112 such that the mounting holes 126 (not visible in FIG. 7D) in the second heatsink 114 are vertically aligned with some or all of the mounting holes 124 (not visible in FIG. 7D) in the first heatsink 112, and the standoff fasteners 130 may be passed through the mounting holes 126 in the second heatsink 114. Finally, as illustrated in FIG. 7E, the second board 104 may be placed over the second heatsink 114, with the mounting holes 1:28 in the second board 104 being aligned with the mounting holes 126 (not visible in FIG. 7E) in the second heatsink 114 to allow for passing of the standoff fasteners 130 therethrough, and with the second chipset (not visible in FIG. 7E) located between the second board and the second heatsink, and thereafter the fasteners 134 may be coupled with the complementary standoff fasteners 130 to mount the heatsink arrangement 110 in the integrated circuit assembly 100. Thereby, in the integrated circuit assembly 100, the set of fins 122 of the second heatsink 114 are interposed with the set of fins 118 of the first heatsink 112, of the heatsink arrangement 110.

Although, herein, the assembly of the integrated circuit assembly 100 has been described in terms of placing the second heatsink 114 over the first heatsink 112 and then placing the second board 104 thereon; in alternate embodiments, the second board 104 with the second heatsink 114 already mounted thereon may be placed over the first heatsink 112 mounted to the first board 102, without departing from the spirit and the scope of the present disclosure. Further, it may be appreciated that the method of attachment of the heatsinks 112, 114 to the respective boards 102, 104 may vary depending on the configuration. In one example, glue or clips may be used to attach the heatsinks 112, 114 to the respective boards 102, 104. In such case, some of the components mentioned above may not be required. Nevertheless, the idea of placing the heatsinks 112, 114 face to face and staggering the corresponding fins 118, 122 to achieve a more compact system configuration design remains the same.

Figure 8:
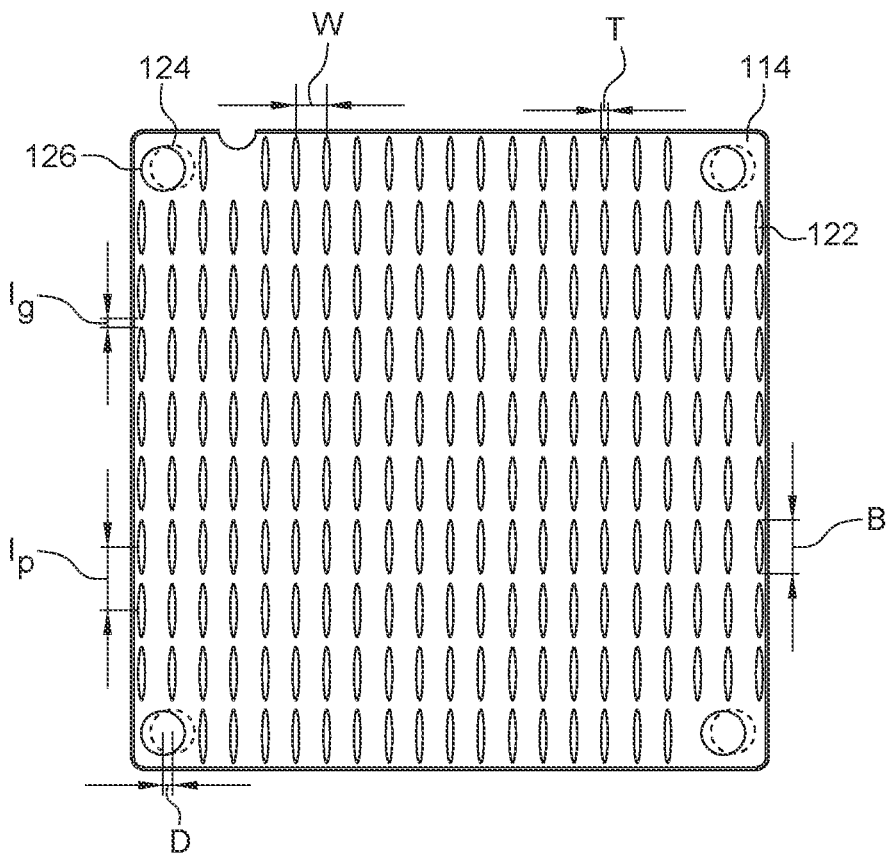
FIG. 8 illustrates a top view of an exemplary integrated circuit assembly in accordance with an embodiment of the present disclosure.

In an embodiment, the set of fins 122 of the second heatsink 114 are formed congruent in relation to the set of fins 118 of the first heatsink 112. In other words, the two heatsinks 112, 114 are generally identical with the same or similar shape and dimensions, and with identical arrangement of respective arrays of fins 118, 122 therein. Having the first heatsink 112 and the second heatsink 114 identical to each other may make manufacturing simpler, because only one design of a heatsink is required. In such a case, the interposing of fins 118, 122 may be achieved by laterally (left-right in FIG. 8) offsetting the second heatsink 114 while placing it over the first heatsink 112, during assembly of the heatsink arrangement 110. In the present embodiments, the mounting holes 126 in the set of mounting holes in the second heatsink 114 may be formed laterally offset with respect to the corresponding mounting holes 124 in the set of mounting holes in the first heatsink 112, if the first and second heatsinks are exactly vertically aligned. FIG. 8 illustrates a top view of the exemplary integrated circuit assembly 100 in accordance with an embodiment of the present disclosure. As illustrated in FIG. 8, the mounting holes 126 in the second heatsink 114 have an offset distance 'D' with respect to the corresponding mounting holes 124 (shown as dashed circles) in the first heatsink 112 (not visible in FIG. 8) from where those holes would have been in an entirely symmetrical (to the midplane of the heatsink) heatsink. Therefore, when the second heatsink 114 is arranged with respect to the first heatsink 112 with the corresponding mounting holes 126 and 124 in the respective sets of mounting holes vertically aligned with respect to each other, i.e., one of the heatsinks is shifted laterally with respect to the other heatsink the distance D, the set of fins 122 of the second heatsink 114 are interposed with (that is, are arranged in interstitial spaces in between) the set of fins 118 of the first heatsink 112. Stated somewhat differently, after ¼W offset from the original hole location and a 180° flip of the second heatsink, the centerline of the mounting holes between first heatsink 112 and second heatsink 114 will be misaligned by W. Therefore, when the mounting holes of the first and second heatsinks are aligned, the fin rows will have a total offset of ½W.

In one or more embodiments, in general, the offset distance for the corresponding mounting holes 124, 126 in the first heatsink 112 and the second heatsink 114 is calculated as:

$$D = \frac{1}{4}W + \frac{n}{2}W,$$

where 'W' is a row pitch (as marked in FIG. 8) between the rows of fins in the set of fins 122 of the second heatsink 114 and is a number of fin rows in the set of fins 122 of the second heatsink 114 to be laterally offset from the fin rows in the set of fins 118 of the first heatsink 112. Herein, the offset distance 'D' is dependent on the row pitch 'W' between the fins in the set of fins 122 of the second heatsink 114, or the fins in the set of fins 118 of the first heatsink 112. In the present embodiments, the offset distance 'D' for the corresponding mounting holes 124, 126 in the first heatsink 112 and the second heatsink 114 is at least one-fourth of the row pitch 'W' for the fins in the set of fins 122 of the second heatsink 114, because n=0; that is, no row of fins on one heatsink is to 'jump over' a row of fins on the other heatsink. It may be appreciated that after one-fourth of the row pitch 'W'

$$\left(\text{i.e., } \frac{1}{4}W\right)$$

offset from mounting hold 124 and flipping of the second heatsink 114, the centerline of the mounting holes 124, 126 between the first heatsink 112 and the second heatsink 114 will become misaligned by half of the row pitch 'W'

$$\left(\text{i.e., } \frac{1}{2}W\right).$$

Therefore, when the mounting holes 124, 126 of the corresponding heatsinks 112, 114 are vertically aligned, the fins 118, 122 will have a total offset of ½W. Thus, each fin 122 of the second heatsink 114 would be placed generally in a middle of the distance (i.e., row pitch 'W') between each fin 118 of the first heatsink 112. In general terms, however, when the mounting holes' location offset from the original mounting holes location is ½ W, then the fin row offset D will equal the full fin pitch distance, W, after the second heatsink flips 180°. Therefore, if a designer wishes to offset fin rows more than one full fin pitch distance W, it will be (n/2)×W, where n is the number of fin rows to be offset, and thus, the mounting offset equation is as stated above.

In such an embodiment, with the mounting holes in the set of mounting holes in the second heatsink formed laterally offset with respect to the corresponding mounting holes in the set of mounting holes in the first heatsink, and with the set of fins of the second heatsink formed congruent in relation to the set of fins of the first heatsink, the method for assembling an integrated circuit assembly may include arranging the second heatsink with respect to the first heatsink with the corresponding mounting holes in the respective sets of mounting holes vertically aligned with respect to each other; and inserting a set of standoff fasteners through the complementary mounting holes in the set of mounting holes in the first heatsink and the second heatsink.

FIG. 8 also illustrates: an interfin pitch $I_P$, which may be a distance between corresponding centers of adjacent fins within a single row of fins; an interfin gap $I_G$, which may be a distance between adjacent edges of adjacent fins within a row of fins; a fin width B, which may be the distance between opposite edges of a single fin, in the direction of a fin row; and a fin thickness T, which may be the distance between opposite sides of a single fin, in the direction perpendicular to a fin row.

In another embodiment (not illustrated), similar in some respects to that illustrated in, and described with reference to, FIG. 8, the holes 126 in both heatsinks 112, 114 are located equidistant from the side edges of the heatsink, rather than being offset by the distance D, so that when the two heatsinks are exactly vertically aligned, the holes 126 are also vertically aligned. The rows of fins are all instead shifted laterally the distance D, perpendicular to the rows, instead of the holes 126. This similarly achieves the same result of having the fins of the each heatsink staggered between, interleaved with, and/or interposed with and within the fins of the other heatsink, but may require the elimination of one row of fins from one or both of the heatsinks.

In embodiments, adjacent fins rows of a heatsink may be shifted relative to each other, i.e., shifted a distance perpendicular to the direction of the fin rows, that distance being less than the fin pitch. Fin row shifting along the direction of the fin row may contribute to increased turbulent flow of the air, which may result in improved heat transfer between the heatsinks and the air, because the air is forced to travel a longer, and more serpentine, path through the heatsinks' fins.

In another embodiment, the set of fins 122 of the second heatsink 114 are formed staggered in relation to the set of fins 118 of the first heatsink 112. In other words, the two heatsinks 112, 114 may have the same or a similar shape and dimensions but may not be exactly identical, and may have different (specifically, staggered) arrangement of respective arrays of fins 118, 122 therein. Herein, the second heatsink 114 is arranged with respect to the first heatsink 112 with the corresponding mounting holes 126, 124 in the respective sets of mounting holes aligned with respect to each other. In such case, when the second heatsink 114 is placed over the first heatsink 112 during assembly of the heatsink arrangement 110, the interposing of fins 118, 122 is achieved due to the relatively staggered arrangement of the set of fins 122 of the second heatsink 114 in relation to the set of fins 118 of the first heatsink 112.

In such embodiment, with the set of fins of the second heatsink formed staggered in relation to the set of fins of the first heatsink, the method for assembling an integrated circuit assembly may include arranging the second heatsink with respect to the first heatsink with the corresponding mounting holes in the respective sets of mounting holes aligned with respect to each other; and inserting a set of standoff fasteners through the complementary mounting holes in the set of mounting holes in the first heatsink and the second heatsink.

Figure 9:
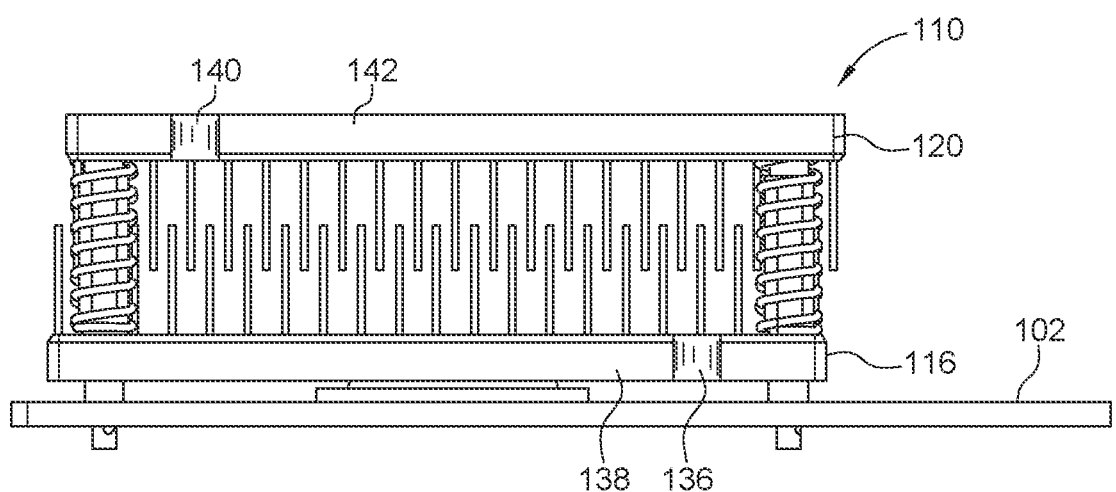
FIG. 9 illustrates a front view of an exemplary integrated circuit assembly in accordance with an embodiment of the present disclosure.

FIG. 9 illustrates a front view of an exemplary integrated circuit assembly in accordance with an embodiment of the present disclosure. Referring to FIG. 9, in an embodiment, as illustrated, the heatsink arrangement 110 may include a marking 136 provided in an edge 138 of the base 116 of the first heatsink 112, and a marking 140 provided in an edge 142 of the base 120 of the second heatsink 114. In the present embodiments, the markings 136, 140 may be in the form of notches formed in the respective edges 138, 142. Herein, the markings 136, 140 in the first heatsink 112 and the second heatsink 114, respectively, may be disposed in a same plane, diagonally opposite to each other, when the first board 102 and the second board 104 are arranged with respect to each other in the integrated circuit assembly 100. This way the markings 136, 140 in the heatsinks 112, 114 may help in orienting the heatsinks 112, 114 properly during assembly of the integrated circuit assembly 100 of the present disclosure. In such an embodiment, the method for assembling an integrated circuit assembly may include disposing the markings in the first heatsink and the second heatsink a same plane, diagonally opposite to each other, to arrange the second heatsink with respect to the first heatsink. In embodiments, the markings 136, 140 may instead include paint, machine-readable codes (e.g., barcodes and the like), etched lines or symbols, adhered stickers, and the like.

A heatsink arrangement 110 of the present disclosure as described above may allow for compacting the layout of the integrated circuit assembly 100 and offer designers more flexibility in designing a high-density system where a mezzanine board is required or used. The present compact heatsink arrangement 110 may be beneficial in any integrated circuit assembly including at least a paired heatsink, one sitting on a main motherboard and the other sitting on a mezzanine board, strategically placed face-to-face with each other. Herein, the fins from one heatsink may be staggered between the fins of the other heatsink that it is paired with, with the heatsinks sandwiched by the motherboard and the mezzanine board and held together by specially designed standoffs with springs.

Figures 10A, 10B:
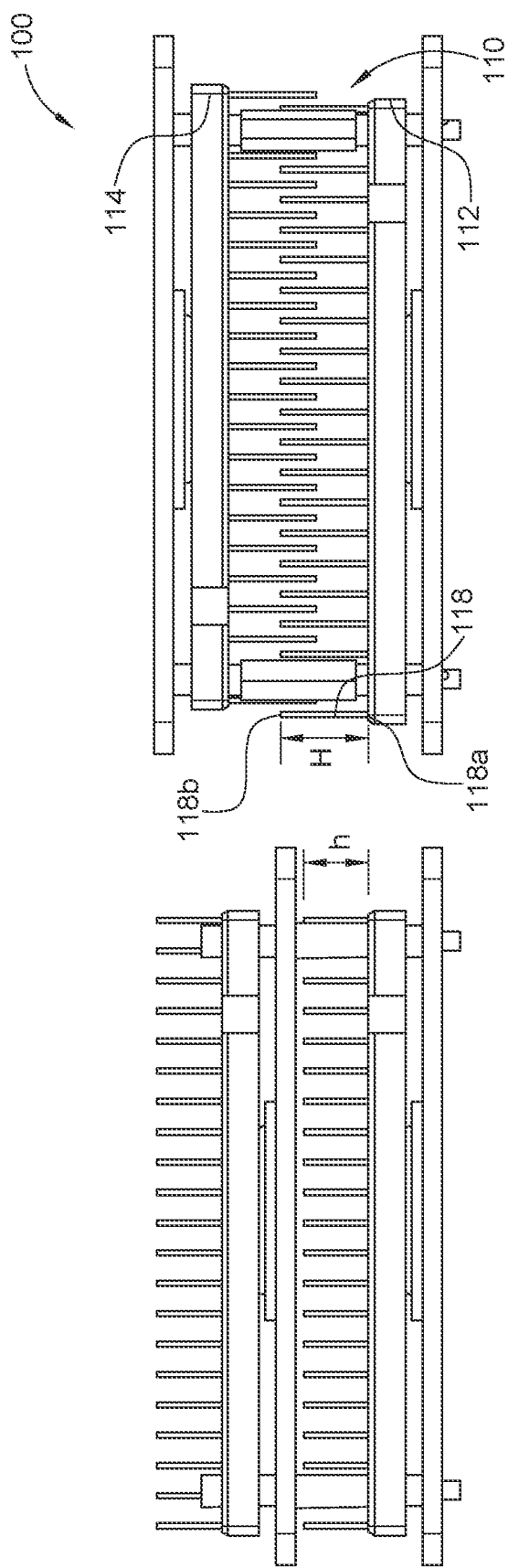
FIG. 10A illustrates a front view of an integrated circuit assembly according to the prior art.
FIG. 10B illustrates a front view of an integrated circuit assembly in accordance with an embodiment of the present disclosure.

FIG. 10A illustrates a front view of an integrated circuit assembly according to the prior art, FIG. 10B illustrates a front view of an integrated circuit assembly (such as, the integrated circuit assembly 100) in accordance with an embodiment of the present disclosure. The idea of placing two heatsinks face-to-face and interposing the fins may significantly reduce the height required for a double layer layout of the integrated circuit assembly 100 (as shown in FIG. 10B) as compared to the conventional configuration (as shown in FIG. 10A), giving designers more flexibility in designing a compact system. The proposed design may further reduce costs since it may only need a fewer number of standoff fasteners and springs to achieve the required exertion forces on the pairing heatsinks arranged in the two layers (as shown in FIG. 1.0B), whereas the conventional double layer layout may require twice the number of spring sets and fasteners (as shown in FIG. 10A). Further, given the same space constraint, the proposed design may allow for additional fin height, such as a height 'H' of fin 118 (as shown in FIG. 10B) which is larger as compared to a height 'h' of a conventional fin (as shown in FIG. 10A); the height H may be such that the free end of a set of fins may be nearly touching the surface of the other heatsink. This may result in more fin area for the present designs, which is therefore capable of achieving higher thermal performance.

Figure 11A:
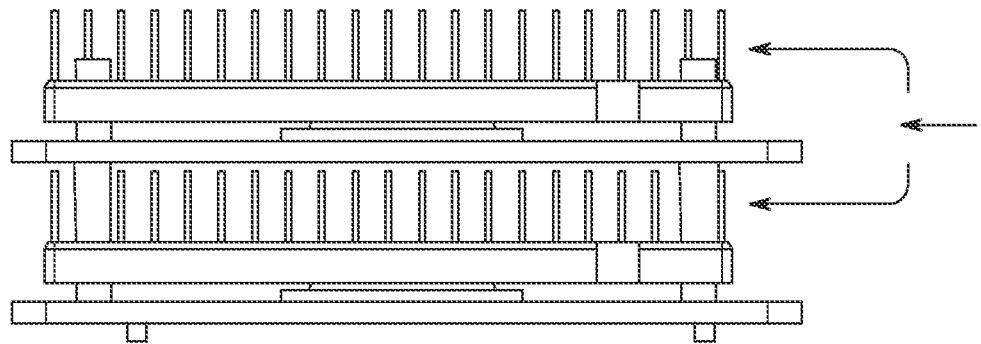
FIG. 11A illustrates a front view of the integrated circuit assembly of FIG. 10A, depicting an air flow therein.
Figure 11B:
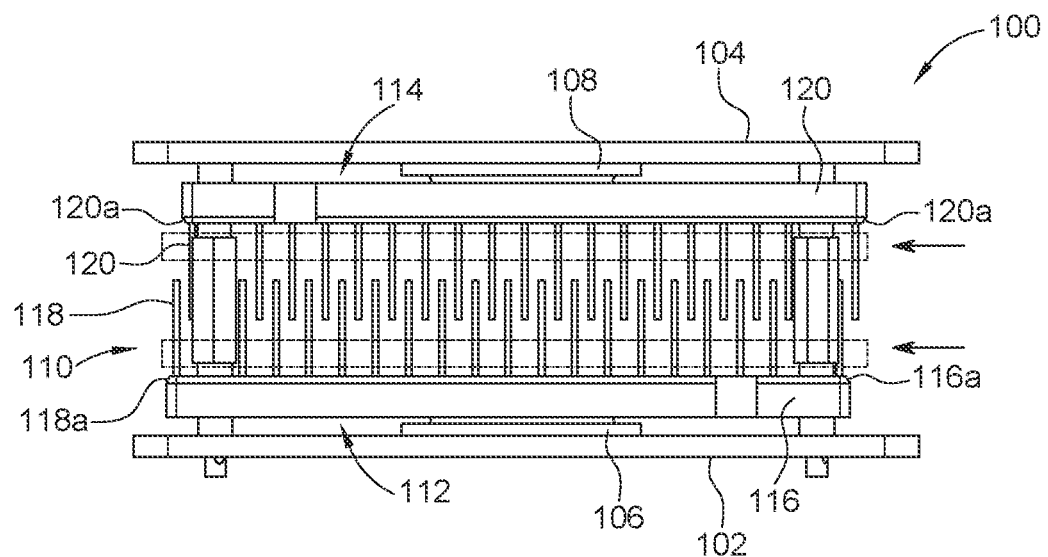
FIG. 11B illustrates a front view of the integrated circuit assembly of FIG. 10B, depicting an air flow therein.

FIG. 11A illustrates a front view of the integrated circuit assembly of FIG. 10A, depicting an air flow therein. FIG. 11B illustrates a front view of the integrated circuit assembly 100 of FIG. 10B, depicting an air flow therein. Herein, the directional arrows represent the air flow in the respective integrated circuit assembly. As may be seen, the conventional double layer design splits the airflow into a top channel or stream and a bottom channel or stream (as shown in FIG. 11A), one channel or stream being directed into the fins of one of the two heatsinks, whereas the present designs allow the entire airflow to concentrate in one channel or stream (as shown in FIG. 11B) which passes between the two heatsinks. Thus, the present heatsink arrangement 110 maximizes the air-to-fin contact and allows the air to be distributed and mixed more evenly between the two heatsinks 112, 114, including when there is significant temperature difference between the two heatsinks 112, 114. The present heatsink arrangement 110 may improve thermal performance by 30% to 50% compared to the traditional layout of FIG. 11A. It may be appreciated that since temperature is usually higher at the base of a heatsink (i.e., near the chipset), it is favorable to have more airflow near the base of the fin to increase the heat dissipation efficiency, because the airflow will impinge on both the fins and the base of each heatsink. The present design forces airflow to go through the base of the fins (i.e., in the regions as represented by the dashed rectangles in FIG. 11B) on a heatsink as opposed to the tips of the fins, since there is less flow impedance at the base as compared to the center area where the fin tips are located because of the reduced contact area between the air and the surfaces being cooled, thus resulting in higher thermal performance. In contrast, the traditional layout has less impedance near the fin tip, because of the space between the fin tips and the overlying heat sink base (see FIG. 11A), which resulted in relatively lower airflow at the base of each heatsink, and thus resulting in lower thermal performance as compared to the present designs. In embodiments, additional air flow impeding structures may be added in the tip region of one or more of the fins of a heatsink to further increase flow resistance in the center section of the assembly 100. Such flow resistance structures may include, but is not limited to, enlargements formed on one or more fins, located at or near one or more of the fin tips.

In embodiments, the cooling fluid may be a liquid, e.g., water and/or other liquid coolants known to those of ordinary skill in the art. When the cooling fluid is a liquid, embodiments include sealing structures, e.g., sidewalls adjacent to and sealing the space between the heatsink bases, and flow conduits and/or manifolds for directing the cold cooling liquid to, and collecting the heated cooling liquid from, the heatsink arrangement. Furthermore, the liquid cooling fluid, the materials of the heatsink, or both, may be selected so that the liquid cooling fluid does not corrode or otherwise negatively effect the heatsinks.

While embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims.

As used herein, and unless the context dictates otherwise, the term "coupled to" is intended to include both direct coupling (in which two elements that are coupled to each other contact each other) and indirect coupling (in which at least one additional element is located between the two elements). Therefore the terms"coupled to" and "coupled with" are used synonymously.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refer to at least one of something selected from the group consisting of A, B, C . . . . and N, the text should be interpreted as requiring only one element from the group, not A plus N, or B plus N, etc.

While the foregoing describes various embodiments of the present disclosure, other and further embodiments of the present disclosure may be devised without departing from the basic scope thereof. The scope of the present disclosure is determined by the claims that follow. The present disclosure is not limited to the described embodiments, versions, or examples, which are included to enable a person having ordinary skill in the art to make and use the present disclosure when combined with information and knowledge available to the person having ordinary skill in the art.

What is claimed is:

1. A heatsink arrangement for an integrated circuit assembly having a first board with a first chipset mounted thereon and a second board with a second chipset mounted thereon, the heatsink arrangement comprising:

a first heatsink comprising a base, having a first side and a second side, and a set of fins extending outwardly from the first side of the base of the first heatsink, with the second side of the base of the first heatsink configured to be disposed in contact with the first chipset; and a second heatsink comprising a base, having a first side and a second side, and a set of fins extending outwardly from the first side of the base of the second heatsink, with the second side of the base of the second heatsink configured to be disposed in contact with the second chipset, wherein the first board and the second hoard are arranged with respect to each other such that the first side of the base of the second heatsink is disposed facing the first side of the base of the first heatsink, with the set of fins of the second heatsink interposed with the set of fins of the first heatsink.

2. The heatsink arrangement of claim 1, wherein each of the first heatsink and the second heatsink comprises a set of mounting holes, and wherein the heatsink arrangement further comprises a set of standoff fasteners complementary to the set of mounting holes, with each standoff fastener in the set of standoff fasteners inserted through one of the mounting holes in the set of mounting holes in the first heatsink and a corresponding one of the mounting holes in the set of mounting holes in the second heatsink.

3. The heatsink arrangement of claim 2, wherein the set of fins of the second heatsink are formed congruent in relation to the set of fins of the first heatsink, and the mounting holes in the set of mounting holes in the second heatsink are formed laterally offset with respect to the corresponding mounting holes in the set of mounting holes in the first heatsink, and wherein the second heatsink is arranged with respect to the first heatsink with the corresponding mounting holes in the respective sets of mounting holes aligned with respect to each other.

4. The heatsink arrangement of claim 3, wherein an offset distance (D) for the corresponding mounting holes in the first heatsink and the second heatsink is calculated as:

$$D = \frac{1}{4}W + \frac{n}{2}W,$$

where 'W' is a row pitch between the fins in the set of fins of the second heatsink and 'n' is a number of fins in the set of fins of the second heatsink to be laterally offset from the fins in the set of fins of the first heatsink.

5. The heatsink arrangement of claim 3, wherein an offset distance for the corresponding mounting holes in the first heatsink and the second heatsink is at least one-fourth of a row pitch for the fins in the set of fins of the second heatsink.

6. The heatsink arrangement of claim 2, wherein the set of fins of the second heatsink are formed staggered in relation to the set of fins of the first heatsink, and wherein the second heatsink is arranged with respect to the first heatsink with the corresponding mounting holes in the respective sets of mounting holes are aligned with respect to each other.

7. The heatsink arrangement of claim 1 further comprising:

a marking provided in an edge of the base of the first heatsink; and a marking provided in an edge, corresponding to the edge of the base of the first heatsink, of the base of the second heatsink, wherein the markings in the first heatsink and the second heatsink are disposed in a same plane, diagonally opposite to each other, when the first board and the second board are arranged with respect to each other in the integrated circuit assembly.

8. The heatsink arrangement of claim 2, wherein each of the fins in the set of fins of the second heatsink has a first end and a second end, and extends from the base of the second heatsink from the first end thereof, and wherein a height of the standoff fasteners is based on a desired gap between the second end of the fins in the set of fins of the second heatsink and the first side of the base of the first heatsink, when the first board and the second board are arranged with respect to each other in the integrated circuit assembly.

9. The heatsink arrangement of claim 8 further comprising a set of springs with each spring in the set of springs arranged over one of the standoff fasteners in the set of standoff fasteners, wherein a force exerted by the set of springs is based on a desired force between the second heatsink and the first heatsink, said force pushing said first board and said second board away from each other, when the first board and the second board are arranged with respect to each other in the integrated circuit assembly.

10. A method for assembling an integrated circuit assembly from a first hoard with a first chipset mounted thereon and a second board with a second chipset mounted thereon, the method comprising:

disposing a first heatsink comprising a base, having a first side and a second side, and a set of fins extending outwardly from the first side of the base of the first heatsink, over the first chipset, with the second side of the base of the first heatsink disposed in contact with the first chipset;

disposing a second heatsink comprising a base, having a first side and a second side, and a set of fins extending outwardly from the first side of the base of the second heatsink, over the first heatsink such that the first side of the base of the second heatsink is disposed facing the first side of the base of the first heatsink, with the set of fins of the second heatsink interposed with the set of fins of the first heatsink; and arranging the first board and the second board with respect to each other such that the second side of the base of the second heatsink is disposed in contact with the second chipset.

11. The method of claim 10, wherein each of the first heatsink and the second heatsink includes a set of mounting holes therein, with the mounting holes in the set of mounting holes in the second heatsink formed laterally offset with respect to the corresponding mounting holes in the set of mounting holes in the first heatsink, and with the set of fins of the second heatsink formed congruent in relation to the set of fins of the first heatsink, the method further comprising:

arranging the second heatsink with respect to the first heatsink with the corresponding mounting holes in the respective sets of mounting holes aligned with respect to each other; and inserting a set of standoff fasteners through the complementary mounting holes in the set of mounting holes in the first heatsink and the second heatsink.

12. The method of claim 10, wherein each of the first heatsink and the second heatsink includes a set of mounting holes therein, with the set of fins of the second heatsink formed staggered in relation to the set of fins of the first heatsink, the method further comprising:

arranging the second heatsink with respect to the first heatsink with the corresponding mounting holes in the respective sets of mounting holes aligned with respect to each other; and inserting a set of standoff fasteners through the complementary mounting holes in the set of mounting holes in the first heatsink and the second heatsink.

13. The method of claim 10, wherein the base of the first heatsink includes a marking in an edge thereof, and the base of the second heatsink includes a marking in an edge thereof corresponding to the edge of the base of the first heatsink, the method further comprising disposing the markings in the first heatsink and the second heatsink in a same plane, diagonally opposite to each other, to arrange the second heatsink with respect to the first heatsink.

14. An integrated circuit assembly comprising:
a first board with a first chipset mounted thereon;
a second board with a second chipset mounted thereon; and
a heatsink arrangement comprising:
a first heatsink comprising a base, having a first side and a second side, and a set of fins extending outwardly from the first side of the base of the first heatsink, with the second side of the base of the first heatsink disposed in contact with the first chipset; and
a second heatsink comprising a base, having a first side and a second side, and a set of fins extending outwardly from the first side of the base of the second heatsink, with the second side of the base of the second heatsink disposed in contact with the second chipset,
wherein the first board and the second board are arranged with respect to each other such that the first side of the base of the second heatsink is disposed facing the first side of the base of the first heatsink, with the set of fins of the second heatsink interposed with the set of fins of the first heatsink.

15. The integrated circuit assembly of claim 14, wherein each of the first heatsink and the second heatsink comprises a set of mounting holes, and wherein the heatsink arrangement further comprises a set of standoff fasteners complementary to the set of mounting holes, with each standoff fastener in the set of standoff fasteners inserted through one of the mounting holes in the set of mounting holes in the first heatsink and a corresponding one of the mounting holes in the set of mounting holes in the second heatsink.

16. The integrated circa it assembly of claim 15, wherein the set of fins of the second heatsink are formed congruent in relation to the set of fins of the first heatsink, and the mounting holes in the set of mounting holes in the second heatsink are formed laterally offset with respect to the corresponding mounting holes in the set of mounting holes in the first heatsink, and wherein the second heatsink is arranged with respect to the first heatsink with the corresponding mounting holes in the respective sets of mounting holes are aligned with respect to each other.

17. The integrated circuit assembly of claim 16, wherein an offset distance (D) for the corresponding mounting holes in the first heatsink and the second heatsink is calculated as:

$$D = \frac{1}{4}W + \frac{n}{2}W,$$

where 'W' is a row pitch between the fins in the set of fins of the second heatsink and 'n' is a number of fins in the set of fins of the second heatsink to be laterally offset from the fins in the set of fins of the first heatsink.

18. The integrated circuit assembly of claim 16, wherein an offset distance for the corresponding mounting holes in the first heatsink and the second heatsink is at least one-fourth of a row pitch for the fins in the set of fins of the second heatsink.

19. The integrated circuit assembly of claim 15, wherein the set of fins of the second heatsink are formed staggered in relation to the set of fins of the first heatsink, and wherein the second heatsink is arranged with respect to the first heatsink with the corresponding mounting holes in the respective sets of mounting holes are aligned with respect to each other.

20. The integrated circuit assembly of claim 14 further comprising:
a marking provided in an edge of the base of the first heatsink; and
a marking provided in an edge, corresponding to the edge of the base of the first heatsink, of the base of the second heatsink,
wherein the markings in the first heatsink and the second heatsink are disposed in a same plane, diagonally opposite to each other, when the first board and the second board are arranged with respect to each other in the integrated circuit assembly.

* * * * *